United States Patent
Sugimoto et al.

(10) Patent No.: US 8,633,101 B2
(45) Date of Patent: Jan. 21, 2014

(54) SEMICONDUCTOR DEVICE AND MANUFACTURING METHOD OF SEMICONDUCTOR DEVICE

(75) Inventors: Masahiro Sugimoto, Toyota (JP); Akinori Seki, Shizuoka-ken (JP); Akira Kawahashi, Komaki (JP); Yasuo Takahashi, Suita (JP); Masakatsu Maeda, Suita (JP)

(73) Assignee: Toyota Jidosha Kabushiki Kaisha, Toyota-Shi (JP)

( * ) Notice: Subject to any disclaimer, the term of this patent is extended or adjusted under 35 U.S.C. 154(b) by 0 days.

(21) Appl. No.: 13/499,652

(22) PCT Filed: Sep. 2, 2010

(86) PCT No.: PCT/JP2010/065013
§ 371 (c)(1),
(2), (4) Date: May 18, 2012

(87) PCT Pub. No.: WO2011/040172
PCT Pub. Date: Apr. 7, 2011

(65) Prior Publication Data
US 2012/0217639 A1    Aug. 30, 2012

(30) Foreign Application Priority Data

Oct. 1, 2009  (JP) ................. 2009-229381

(51) Int. Cl.
| | | |
|---|---|---|
| H01L 23/48 | (2006.01) | |
| H01L 23/52 | (2006.01) | |
| H01L 29/40 | (2006.01) | |
| H01L 21/44 | (2006.01) | |
| H01L 21/302 | (2006.01) | |
| H01L 21/461 | (2006.01) | |
| H01L 21/31 | (2006.01) | |

(52) U.S. Cl.
USPC ........... 438/612; 438/597; 438/627; 438/643; 438/648; 438/652; 438/653; 438/656; 438/658; 438/685; 257/779; 257/780; 257/781; 257/748; 257/751; 257/763; 257/764; 257/767; 257/770; 257/E21.584; 257/E23.163

(58) Field of Classification Search
None
See application file for complete search history.

(56) References Cited

U.S. PATENT DOCUMENTS 5,965,911 A  * 10/1999 Joo et al. ................... 257/288
6,072,818 A     6/2000 Hayakawa
(Continued)

FOREIGN PATENT DOCUMENTS

| | | |
|---|---|---|
| JP | 05-315595 A | 11/1993 |
| JP | 06-120164 A | 4/1994 |

(Continued)

OTHER PUBLICATIONS

Ippei Fujimoto et al.: "Effects of Vacuum Annealing on Electrical Properties of GaN Contacts", Journal of Electronic Materials, 2003, vol. 32, pp. 957-963.

(Continued)

*Primary Examiner* — David Zarneke
(74) *Attorney, Agent, or Firm* — Kenyon & Kenyon LLP

(57) ABSTRACT

A manufacturing method of a semiconductor device including an electrode having low contact resistivity to a nitride semiconductor is provided. The manufacturing method includes a carbon containing layer forming step of forming a carbon containing layer containing carbon on a nitride semiconductor layer, and a titanium containing layer forming step of forming a titanium containing layer containing titanium on the carbon containing layer. A complete solid solution Ti (C, N) layer of TiN and TiC is formed between the titanium containing layer and the nitride semiconductor layer. As a result, the titanium containing layer comes to be in ohmic contact with the nitride semiconductor layer throughout the border therebetween.

3 Claims, 3 Drawing Sheets

(56) References Cited

U.S. PATENT DOCUMENTS

| | | | |
|---|---|---|---|
| 6,436,819 B1* | 8/2002 | Zhang et al. | 438/656 |
| 6,746,962 B2* | 6/2004 | Kishida et al. | 438/705 |
| 7,144,768 B2* | 12/2006 | Chung | 438/239 |
| 7,846,841 B2* | 12/2010 | Ishizaka et al. | 438/687 |
| 7,851,915 B2* | 12/2010 | Caubet et al. | 257/751 |
| 7,863,202 B2* | 1/2011 | Govindarajan | 438/785 |
| 7,972,910 B2* | 7/2011 | Dairiki et al. | 438/149 |
| 8,319,296 B2* | 11/2012 | Do et al. | 257/412 |
| 8,324,706 B2* | 12/2012 | Yoshizumi et al. | 257/500 |
| 8,372,746 B2* | 2/2013 | Do et al. | 438/653 |
| 2004/0159944 A1* | 8/2004 | Datta et al. | 257/737 |
| 2006/0014369 A1* | 1/2006 | Graettinger | 438/612 |
| 2006/0145201 A1 | 7/2006 | Shiga | |
| 2006/0270206 A1* | 11/2006 | Cho et al. | 438/597 |
| 2007/0034892 A1* | 2/2007 | Song | 257/103 |
| 2009/0134456 A1 | 5/2009 | Sugimoto | |
| 2009/0191659 A1* | 7/2009 | Song | 438/46 |
| 2009/0214894 A1* | 8/2009 | Kohara et al. | 428/702 |
| 2010/0155951 A1* | 6/2010 | Koike et al. | 257/751 |
| 2010/0221897 A1* | 9/2010 | Seong | 438/481 |
| 2011/0121459 A1* | 5/2011 | Onishi et al. | 257/751 |
| 2011/0244656 A1* | 10/2011 | Dairiki et al. | 438/460 |

FOREIGN PATENT DOCUMENTS

| | | |
|---|---|---|
| JP | 09-266351 A | 10/1997 |
| JP | 2000-315817 A | 11/2000 |
| JP | 2001-044139 A | 2/2001 |
| JP | 2006-190749 A | 7/2006 |
| JP | 2007-005764 A | 1/2007 |
| JP | 2008-235405 A | 10/2008 |

OTHER PUBLICATIONS

Liang Wang et al.: "Formation Mechanism of Ohmic Contacts on AlGaN/GaN Heterostructure: Electrical and Microstructural Characterizations", Journal of Applied Physics 103, 093516 (2008), American Institute of Physics, pp. 1-10.

Masahiro Sakai et al.: "Effect of Various Interlayers on Epiwafer Bowing in AlGaN/GaN High-Electron-Mobility Transistor Structures", Journal of Applied Physics, vol. 43, No. 12, 2004, pp. 8019-8023.

International Search Report and Written Opinion of PCT/JP 2010/065013 mailed Oct. 26, 2010 and partial English translation of Written Opinion.

Written Opinion of IPEA of PCT/JP2010/065013 mailed Mar. 8, 2011 and partial English translation thereof.

International Preliminary Report on Patentability of PCT/JP2010/065013 mailed May 19, 2011 and English translation thereof.

* cited by examiner

SEMICONDUCTOR DEVICE AND MANUFACTURING METHOD OF SEMICONDUCTOR DEVICE

This is a 371 national phase application of PCT/JP2010/065013 filed 02 Sep. 2010, which claims priority to Japanese Patent Application No. 2009-229381 filed 01 Oct. 2009, the contents of which are incorporated herein by reference.

TECHNICAL FIELD

The technology described herein relates to a semiconductor device including an electrode in ohmic contact with a nitride semiconductor layer.

BACKGROUND ART

As disclosed in Japanese Patent Application Laid-open No. 2008-235405 (hereinafter referred to as Patent document 1), Ti is generally used as a material of an electrode in ohmic contact with a GaN layer. Generally, the electrode is formed by forming a Ti layer on the GaN layer and then heat-treating a semiconductor substrate. By the heat treatment of the semiconductor substrate, a TiN layer is formed between the Ti layer and the GaN layer. The TiN layer shows a good ohmic property on the GaN layer. Thus, the Ti layer serves as an ohmic electrode on the GaN layer.

SUMMARY OF INVENTION

Technical Problem

According to the above electrode forming method, the TiN layer is formed in a form of islands at a border of the Ti layer and the GaN layer. Namely, the TiN layer is not formed throughout the border of the Ti layer and the GaN layer, but is formed partially at the border. This is because TiN is segregated at the border of the Ti layer and the GaN layer during the heat treatment. Therefore, according to the above electrode forming method, contact resistivity between the Ti layer and GaN layer is high because of the TiN layer formed in the form of islands at the border of the Ti layer and the GaN layer.

A semiconductor device including an electrode having low contact resistivity to the nitride semiconductor and a manufacturing method thereof are provided herein.

Solution to Problem

A manufacturing method of the semiconductor device disclosed herein includes a carbon containing layer forming step and a titanium containing layer forming step. In the carbon containing layer forming step, a carbon containing layer containing carbon is formed on a nitride semiconductor layer. In the titanium containing layer forming step, a titanium containing layer containing titanium is formed on the carbon containing layer.

When the titanium containing layer is formed on the carbon containing layer, Ti (C, N) which is a complete solid solution of TiN and TiC is formed from N in the nitride semiconductor layer, C in the carbon containing layer and Ti in the titanium containing layer. Ti (C, N) shows an excellent ohmic property on the nitride semiconductor layer. As Ti (C, N) is a complete solid solution, it is difficult to be segregated. Therefore, the titanium containing layer comes to be in ohmic contact with the nitride semiconductor layer over a broad area. Thus, contact resistivity between the titanium containing layer and the nitride semiconductor layer is lower than conventional electrodes. According to the present manufacturing method, the semiconductor device can be obtained including an electrode (i.e. titanium containing layer) having lower contact resistivity to the nitride semiconductor layer than the conventional electrodes.

The manufacturing method described above may include an annealing step of heating the semiconductor substrate after the titanium containing layer forming step. When the annealing step is carried out after the titanium containing layer forming step, the contact resistivity between the nitride semiconductor layer and the titanium containing layer is further decreased. The reason for this is believed to be that the reaction of formation of the complete solid solution Ti (C, N) from N in the nitride semiconductor layer, C in the carbon containing layer and Ti in the titanium containing layer is promoted by the annealing step.

The semiconductor device including an electrode having low contact resistivity to the nitride semiconductor layer is also provided herein. The semiconductor device includes the nitride semiconductor layer, a complete solid solution layer and the titanium containing layer. The complete solid solution layer is formed on the nitride semiconductor layer and formed of a complete solid solution of titanium carbide and titanium nitride. The titanium containing layer is formed on the complete solid solution layer and contains titanium.

In this semiconductor device, the titanium containing layer is in contact with the nitride semiconductor layer via the complete solid solution layer. Thus, contact resistivity between the titanium containing layer and the nitride semiconductor layer is low. The titanium containing layer serves as an excellent ohmic electrode on the nitride semiconductor layer.

EMBODIMENTS OF INVENTION (Embodiments)

The manufacturing methods of the semiconductor devices according to embodiments are now described. The present manufacturing methods are characteristic in their step of forming an electrode, and thus descriptions on other steps (steps by which various regions are formed in the semiconductor substrate etc.) are omitted.

(First Embodiment)

Figure 1:
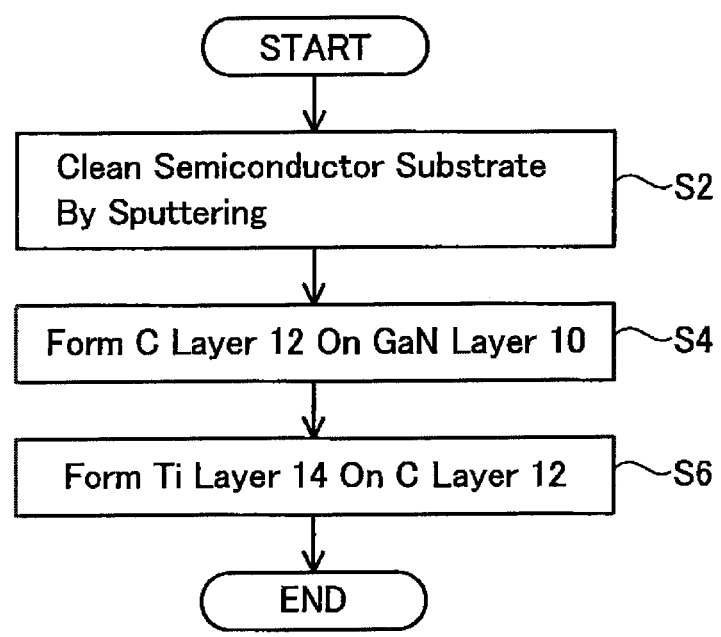
FIG. 1 is a flowchart showing steps of electrode formation in the manufacturing method of the semiconductor device of a first embodiment.
Figure 2:
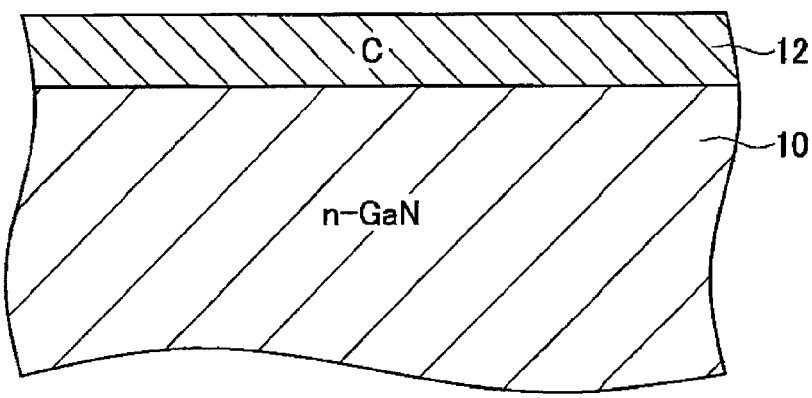
FIG. 2 is a sectional view showing the vicinity of a surface of an n-type GaN layer 10 after formation of a C layer 12.
Figure 3:
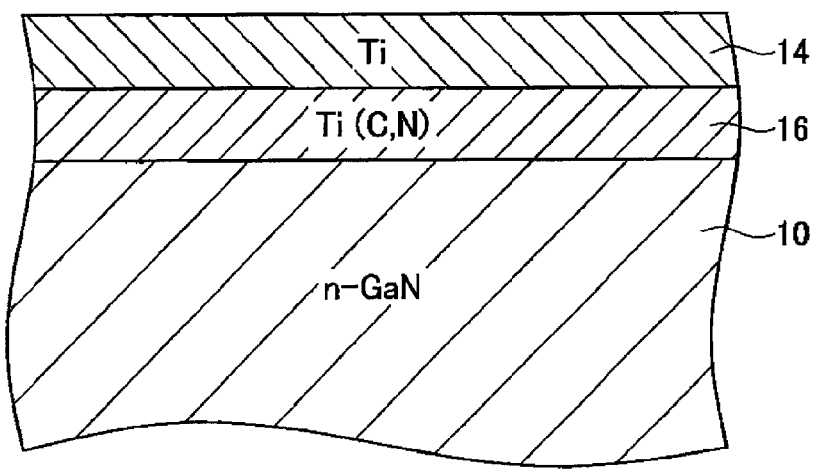
FIG. 3 is a sectional view showing the vicinity of the surface of the n-type GaN layer 10 after formation of a Ti layer 14.

According to the manufacturing method of the first embodiment, an electrode is formed on a surface of a semiconductor substrate following the flowchart in FIG. 1. According to the present embodiment, the electrode is formed on a surface of an n-type GaN layer in the semiconductor substrate. In step S2, the surface of the semiconductor substrate is cleaned by sputtering. In step S4, a C layer 12 formed of carbon is formed on the surface of the n-type GaN layer 10 by sputtering, as shown in FIG. 2. In step S6, a Ti layer 14 formed of titanium is formed on a surface of the C layer 12 by sputtering. When the Ti layer 14 is formed in step S6, the layer 16 of Ti (C, N) which is a complete solid solution of TiC and TiN is formed between the Ti layer 14 and the GaN layer 10 as shown in FIG. 3. The reason for this is believed to be that Ti in the Ti layer 14, C in the C layer 12 and N in the GaN layer 10 undergo reaction due to the heat during sputtering of the Ti layer 14. The Ti layer 14 formed in step S6 serves as the electrode of the semiconductor device.

In steps S4 and S6, the C layer 12 and the Ti layer 14 are selectively formed in a region where the electrode should be formed. The C layer 12 and the Ti layer 14 may be selectively formed by well-known techniques. In step S6, the Ti layer 14 is formed so as to have a greater thickness than the C layer 12 formed in step S4.

By formation of the Ti layer 14, ohmic contact between the Ti layer 14 and the GaN layer 10 has low contact resistivity. The reason for this is believed to be as follows. TiC and TiN show ohmic properties on n-type GaN. Therefore, Ti (C, N) which is the complete solid solution of TiC and TiN also shows ohmic properties on n-type GaN. In addition, Ti (C, N) is hard to be segregated because it is complete solid solution. Therefore, in step S6, the Ti (C, N) layer 16 is uniformly formed throughout the border of the Ti layer 14 and the GaN layer 10. Accordingly, the Ti layer 14 formed in step S6 is in ohmic contact with the GaN layer 10 throughout the border with the GaN layer 10. Therefore, the Ti layer 14 has smaller contact resistivity to the GaN layer than conventional electrodes which are in ohmic contact with the GaN layer in the form of islands.

Figure 4:
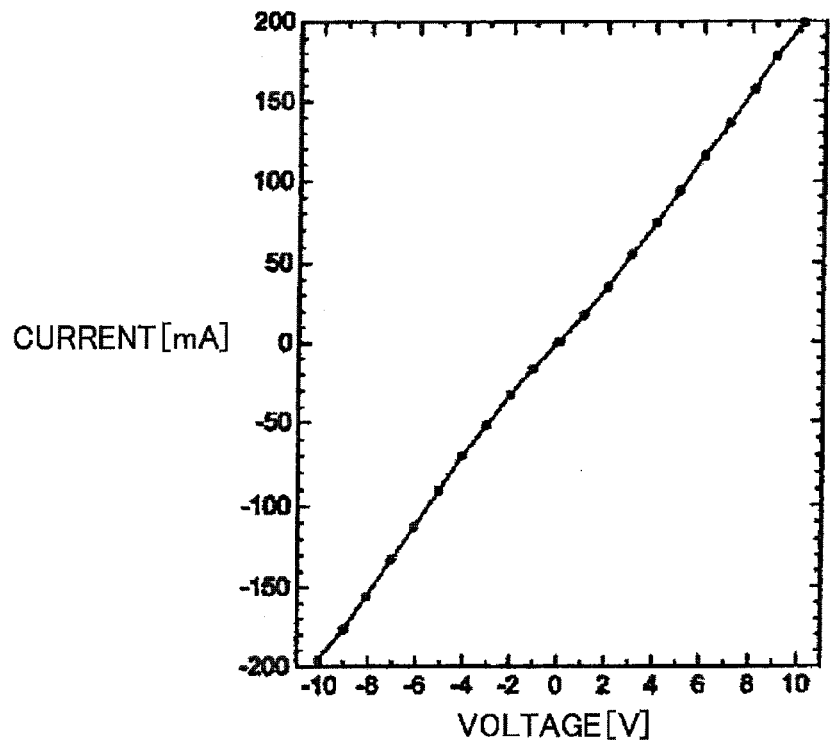
FIG. 4 is a graph showing current-voltage characteristics of an electrode formed by a conventional method.
Figure 5:
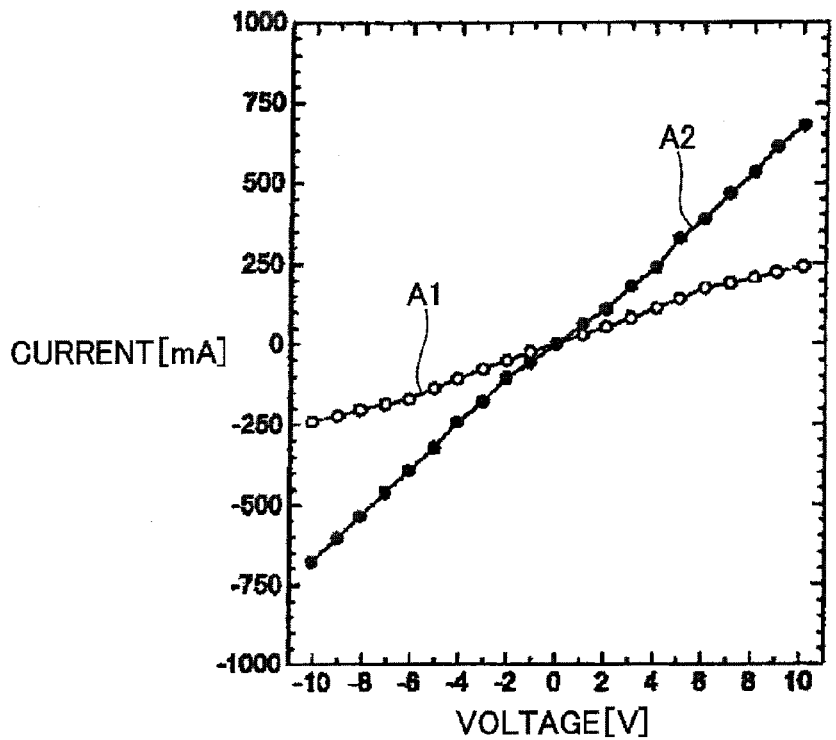
FIG. 5 is a graph showing current-voltage characteristics of electrodes formed by methods in first and second embodiments.

FIG. 4 shows current-voltage characteristics between the Ti layer and the n-type GaN layer when the Ti layer is formed by a conventional method (i.e. a method in which the Ti layer is formed directly on the n-type GaN layer and then the semiconductor substrate is annealed). A1 in FIG. 5 represents current-voltage characteristics between the Ti layer 14 and the n-type GaN layer 10 formed by the manufacturing method of the first embodiment. It is found by comparing FIGS. 4 and 5 that the Ti layer 14 formed by the manufacturing method of the first embodiment has lower contact resistivity than the Ti layer formed by the conventional method. Therefore, the Ti layer 14 formed by the manufacturing method of the first embodiment serves as an excellent ohmic electrode.

(Second Embodiment)

The manufacturing method of the semiconductor device of the second embodiment is now described. In the manufacturing method of the second embodiment, steps S2 to S6 are carried out in the same manner as the manufacturing method of the first embodiment. In addition, in the manufacturing method of the second embodiment, the semiconductor substrate is annealed after step S6. In annealing, the semiconductor substrate is maintained at a temperature of about 873 K for about 300 seconds.

A2 in FIG. 5 represents current-voltage characteristics between the Ti layer 14 and the n-type GaN layer 10 formed by the manufacturing method of the second embodiment. As shown in FIG. 5, contact resistivity of the Ti layer 14 to the GaN layer 10 is further decreased by annealing the semiconductor substrate. According to the manufacturing method of the second embodiment, the semiconductor device can be manufactured with an electrode having even lower contact resistivity.

As explained above, according to the manufacturing methods of the first and second embodiments, the semiconductor device can be manufactured with the electrode (i.e. Ti layer 14) having lower contact resistivity to the n-type GaN layer 10 compared to the conventional electrode. According to the manufacturing method of the first embodiment, the Ti layer 14 is in ohmic contact with the GaN layer 10 without annealing the semiconductor substrate after formation of the Ti layer 14. Thus, the semiconductor device can be manufactured with higher manufacturing efficacy than the conventional method. According to the manufacturing method of the second embodiment, the semiconductor device with the electrode having further lower contact resistivity compared to the first embodiment can be manufactured.

According to the first and second embodiments described above, the Ti layer 14 formed in a greater thickness than the C layer 12 in step S6. By forming the Ti layer 14 having a greater thickness than the C layer 12, the whole C layer 12 can undergo reaction so that the Ti (C, N) layer 16 is formed throughout an entire region between the GaN layer 10 and the Ti layer 14. Namely, the C layer 12 is prevented from remaining between the GaN layer 10 and the Ti layer 14. Due to this, the contact resistivity of the Ti layer 14 can further be decreased.

In the first and second embodiments described above, the C layer 12 was formed by sputtering, but the C layer 12 may alternatively be formed by evaporation or the like. In the first and second embodiments described above, the Ti layer 14 was formed by sputtering, but the Ti layer 14 may alternatively be formed by evaporation or the like. Even if the Ti layer 14 is formed by evaporation in the first and second embodiments, lower contact resistivity can be provided.

In the first and second embodiments described above, the Ti layer 14 was exposed at the surface. However, other metal layer(s) (e.g. Al, Ni, Au etc.) may be formed on the Ti layer 14 to obtain an electrode having a multilayer structure.

The manufacturing methods of the first and second embodiments can be used for manufacture of various semiconductor devices such as manufacture of LEDs or GaN-based power devices (diodes, transistors etc.).

What is claimed is:

1. A manufacturing method of a semiconductor device, the method comprising:
   a carbon layer forming step of forming a carbon layer on an n-type nitride semiconductor layer; and
   a titanium layer forming step of forming a titanium layer on the carbon layer,
   wherein a complete solid solution layer of titanium carbide and titanium nitride is formed on the nitride semiconductor layer by causing nitrogen in the nitride semiconductor layer, carbon in the carbon layer, and titanium in the titanium layer to react with each other.

2. The method of claim 1, further comprising an anneal step of heating a semiconductor substrate after the titanium layer forming step.

3. A semiconductor device comprising:
   an n-type nitride semiconductor layer;
   a complete solid solution layer in ohmic contact with the nitride semiconductor layer, the complete solid solution layer being formed on the nitride semiconductor layer and formed of a complete solid solution of titanium carbide and titanium nitride; and
   a titanium layer formed on the complete solid solution layer.

* * * * *